(12) United States Patent
Song et al.

(10) Patent No.: US 10,884,535 B2
(45) Date of Patent: Jan. 5, 2021

(54) DISPLAY DEVICE

(71) Applicant: LG Display Co., Ltd., Seoul (KR)

(72) Inventors: Chang-Hyun Song, Seongnam-si (KR); Jeong-Oh Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/834,218

(22) Filed: Mar. 30, 2020

(65) Prior Publication Data
US 2020/0225795 A1 Jul. 16, 2020

Related U.S. Application Data

(63) Continuation of application No. 15/976,761, filed on May 10, 2018, now Pat. No. 10,642,394.

(30) Foreign Application Priority Data

May 11, 2017 (KR) .......................... 10-2017-0058637

(51) Int. Cl.
| | | |
|---|---|---|
| *G06F 3/041* | (2006.01) | |
| *G06F 3/044* | (2006.01) | |
| *H01L 27/32* | (2006.01) | |
| *H01L 51/00* | (2006.01) | |
| *H01L 51/52* | (2006.01) | |

(52) U.S. Cl.
CPC ............ *G06F 3/0412* (2013.01); *G06F 3/044* (2013.01); *G06F 3/0416* (2013.01); *H01L 27/322* (2013.01); *H01L 27/323* (2013.01); *H01L 27/3276* (2013.01); *H01L 51/0097* (2013.01); *H01L 51/5256* (2013.01); *G06F 2203/04102* (2013.01); *G06F 2203/04111* (2013.01); *G06F 2203/04112* (2013.01); *H01L 2251/5338* (2013.01)

(58) Field of Classification Search
CPC ...... G06F 3/0412; G06F 3/0416; G06F 3/044; G06F 2203/04111; G06F 2203/04102; G06F 2203/04112; G06F 3/04164; G06F 3/04166; G06F 3/0446; G06F 3/0443; G06F 2203/04103; H01L 27/3276; H01L 27/323; H01L 27/322; H01L 51/0097; H01L 51/5256; H01L 2251/5338; H01L 51/5253; Y02E 10/549

See application file for complete search history.

(56) References Cited

U.S. PATENT DOCUMENTS 5,001,308 A * 3/1991 Mori .................... H01H 13/702
200/292
5,592,199 A * 1/1997 Kawaguchi ......... G02F 1/13452
257/E23.065

(Continued)

*Primary Examiner* — Benyam Ketema
(74) *Attorney, Agent, or Firm* — Seed Intellectual Property Law Group LLP (57) ABSTRACT

Disclosed is a display device capable of reducing the thickness and the weigh thereof. A display device having a touch sensor realizes electrical connection of a routing line and a touch pad via an auxiliary conductive layer, which is connected to the routing line under an encapsulation unit, even if a disconnection fault occurs in the routing line, thereby achieving increased yield and reliability. In addition, through the provision of a touch sensor disposed above the encapsulation unit, a separate attachment process is unnecessary, which results in a simplified manufacturing process and reduced costs.

20 Claims, 9 Drawing Sheets

(56) References Cited

U.S. PATENT DOCUMENTS

| | | | | |
|---|---|---|---|---|
| 6,300,997 B1* | 10/2001 | Saito | ............... | G02F 1/1345 |
| | | | | 349/149 |
| 7,164,460 B2* | 1/2007 | Hagiwara | ............ | G02F 1/13452 |
| | | | | 257/E21.514 |
| 7,202,855 B2* | 4/2007 | Shigetaka | ............ | G06F 3/044 |
| | | | | 178/18.01 |
| 8,253,320 B2* | 8/2012 | Nakanishi | ............ | H05B 33/02 |
| | | | | 313/500 |
| 8,416,202 B2* | 4/2013 | Akimoto | ............ | G06F 3/041 |
| | | | | 345/173 |
| 8,711,108 B2* | 4/2014 | Grunthaner | ............ | G06F 3/044 |
| | | | | 345/173 |
| 9,411,203 B2* | 8/2016 | Kimura | ............ | G02F 1/133512 |
| 10,749,140 B2* | 8/2020 | Park | ............ | H01L 51/5256 |
| 2010/0321326 A1* | 12/2010 | Grunthaner | ............ | G06F 3/044 |
| | | | | 345/174 |
| 2015/0220191 A1* | 8/2015 | Huh | ............ | G06F 3/044 |
| | | | | 345/173 |
| 2016/0154499 A1* | 6/2016 | Bae | ............ | G06F 3/0412 |
| | | | | 345/174 |
| 2017/0108964 A1* | 4/2017 | Sato | ............ | G06F 3/0446 |
| 2018/0059862 A1* | 3/2018 | Zeng | ............ | G06F 3/0412 |
| 2018/0204886 A1* | 7/2018 | Lee | ............ | H01L 27/323 |
| 2018/0308902 A1* | 10/2018 | Lee | ............ | G06F 3/0416 |
| 2018/0323240 A1 | 11/2018 | Won et al. | | |

* cited by examiner

FIG. 9B

DISPLAY DEVICE

CROSS-REFERENCE TO RELATED APPLICATION

This application is a continuation of U.S. patent application Ser. No. 15/976,761, filed May 10, 2018, which claims the benefit of Korean Patent Application No. 10-2017-0058637, filed on May 11, 2017, which is hereby incorporated by reference as if fully set forth herein.

BACKGROUND

Technical Field

The present disclosure relates to a display device, and more particularly, to a display device capable of achieving a simplified manufacturing process and reduced costs.

Description of the Related Art

A touchscreen is an input device that allows a user to input a command by selecting a content appearing on a screen of a display device or the like with the human hand or an object. That is, the touchscreen converts a contact position that the human hand or the object directly touches into an electrical signal, and receives the content selected at the contact position as an input signal. The touchscreen may substitute for a separate input device, which is connected to the display device and operates, such as a keyboard or a mouse, and thus the use range thereof is gradually expanding.

Such a touchscreen is generally attached to the front surface of a display panel, such as a liquid crystal display panel or an organic light-emitting diode display panel, via an adhesive in many cases. In this case, since the touchscreen is separately manufactured and attached to the front surface of the display panel, the manufacturing process is complicated and the costs are increased due to addition of such an attachment process.

BRIEF SUMMARY

Accordingly, the present disclosure is directed to a display device that substantially obviates one or more problems due to limitations and disadvantages of the related art.

The present disclosure has been provided to solve the problems described above, and in various embodiments, the present disclosure provides a display device capable of achieving a simplified manufacturing process and reduced costs.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device having a touch sensor realizes electrical connection of a routing line and a touch pad via an auxiliary conductive layer, which is connected to the routing line under an encapsulation unit, even if a disconnection fault occurs in the routing line, thereby achieving increased yield and reliability. In addition, through the provision of a touch sensor disposed above the encapsulation unit, a separate attachment process is unnecessary, which results in a simplified manufacturing process and reduced costs.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Hereinafter, embodiments according to the present disclosure will be described in detail with reference to the accompanying drawings.

Figure 1:
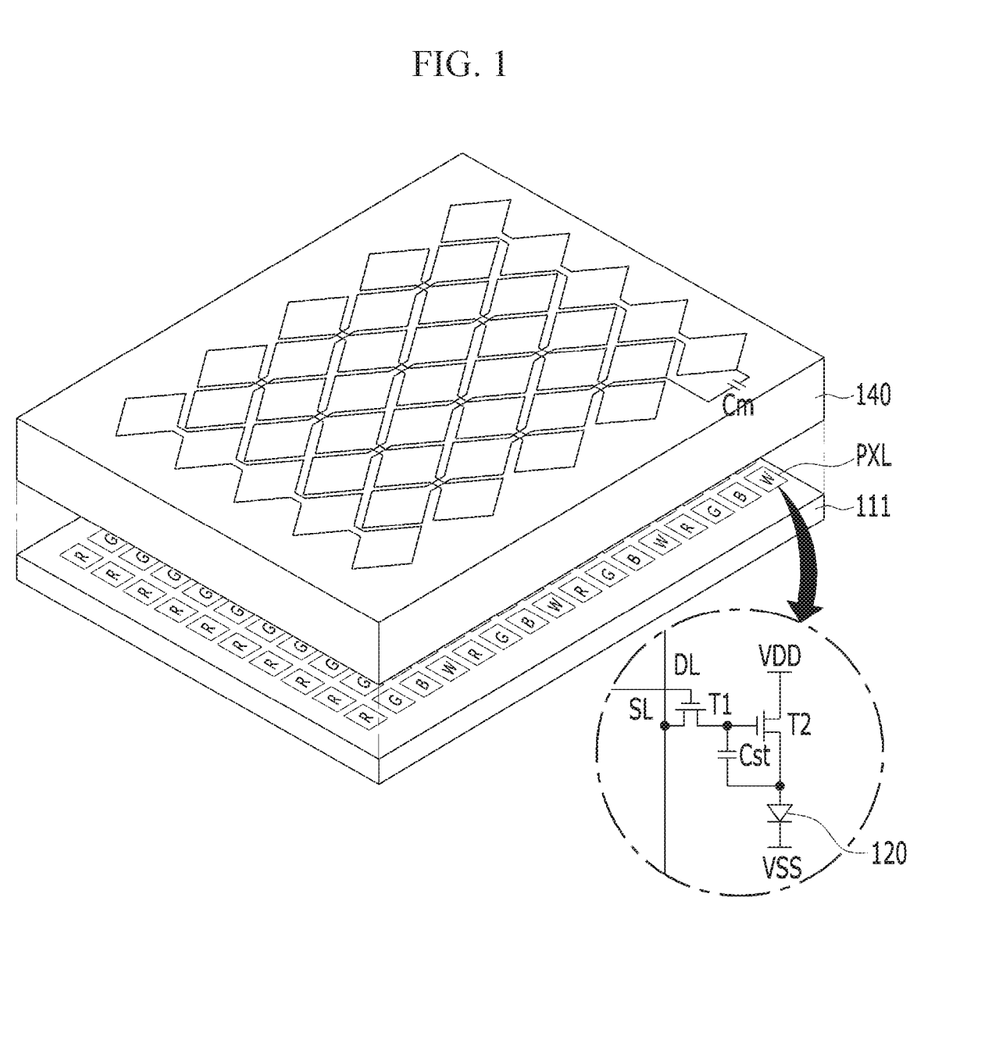
FIG. 1 is a perspective view illustrating an organic light-emitting diode display device having a touch sensor according to a first embodiment of the present disclosure.

FIG. 1 is a perspective view illustrating an organic light-emitting diode display device having a touch sensor according to the present disclosure.

Figure 2:
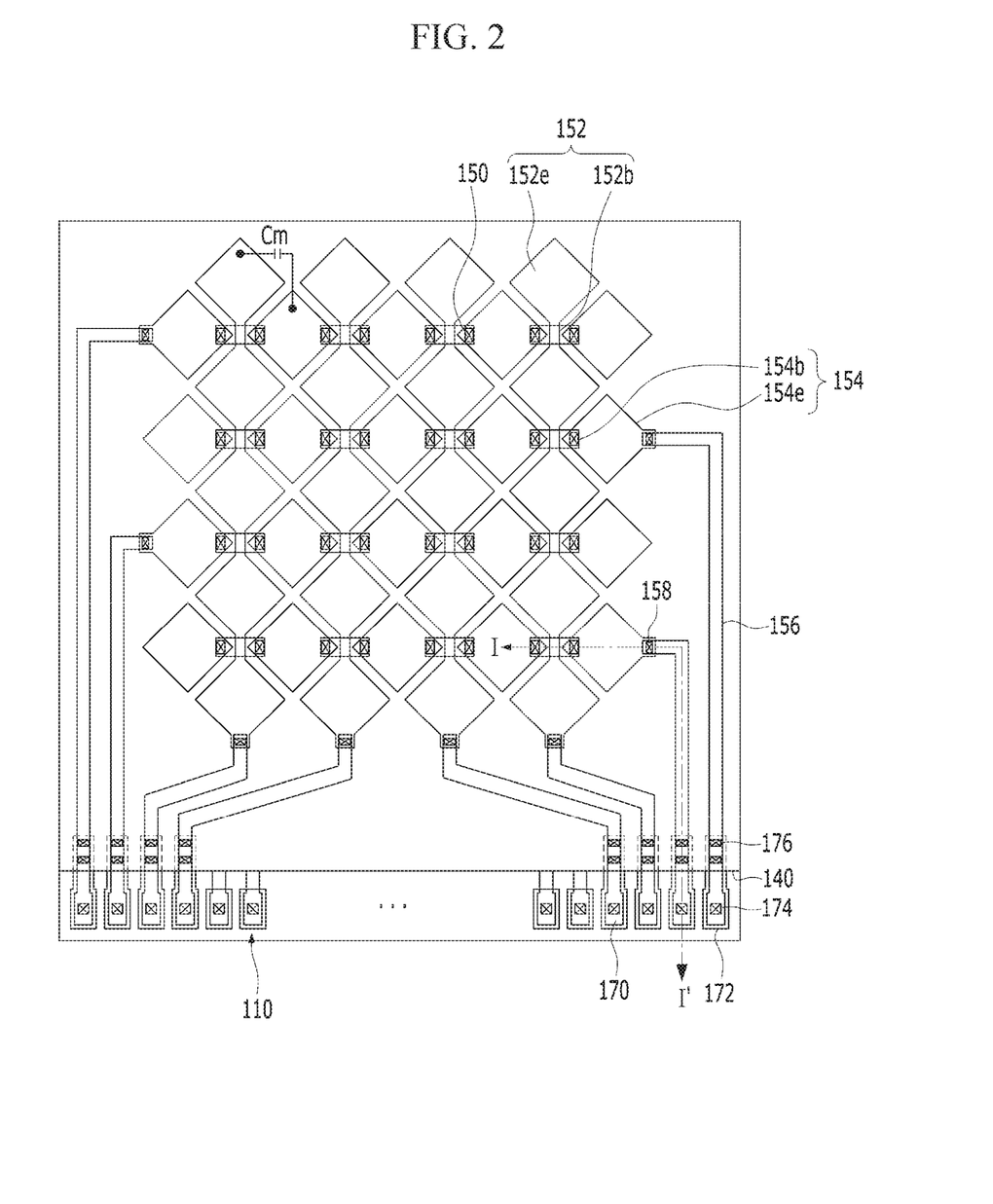
FIG. 2 is a plan view illustrating the organic light-emitting diode display device having the touch sensor illustrated in FIG. 1.

The organic light-emitting diode display device having a touch sensor illustrated in FIG. 1 senses the presence or absence of a touch and a touch position by sensing a variation in mutual capacitance $C_m$ (touch sensor) in response to a user touch via touch electrodes 152e and 154e illustrated in FIG. 2 for a touch period. Then, the organic light-emitting diode display device having a touch sensor illustrated in FIG. 1 displays an image via unit pixels each including a light-emitting element 120. Each unit pixel may include red (R), green (G), and blue (B) subpixels PXL, or may include red (R), green (G), blue (B), and white (W) subpixels PXL.

To this end, the organic light-emitting diode display device illustrated in FIG. 1 includes a plurality of subpixels PXL arranged in a matrix form on a substrate 111 formed of a flexible material or a glass material, an encapsulation unit 140 disposed on the subpixels PXL, and a mutual capacitance array Cm disposed on the encapsulation unit 140.

Each of the subpixels PXL includes a pixel drive circuit and the light-emitting element 120 connected to the pixel drive circuit.

The pixel drive circuit includes a switching transistor T1, a driving transistor T2, and a storage capacitor Cst. Meanwhile, in the present disclosure, a structure in which the pixel drive circuit includes two transistors T and one capacitor C has been described by way of example, but the present disclosure is not limited thereto. That is, a pixel drive circuit having a 3T1C structure or 3T2C structure in which three or more transistors T and one or more capacitors C are provided may be used.

The switching transistor T1 is turned on when a scan pulse is supplied to a scan line SL, and supplies a data signal supplied to a data line DL to the storage capacitor Cst and a gate electrode of the driving transistor T2.

The driving transistor T2 controls current to be supplied from a high-voltage (VDD) supply line to the light-emitting element 120 in response to the data signal supplied to the gate electrode of the driving transistor T2, thereby adjusting the amount of emission of light from the light-emitting element 120. Then, even if the switching transistor T1 is turned off, the driving transistor T2 maintains the emission of light of the light-emitting element 120 by supplying a constant amount of current thereto by a voltage charged in the storage capacitor Cst until a data signal of a next frame is supplied.

Figure 3:
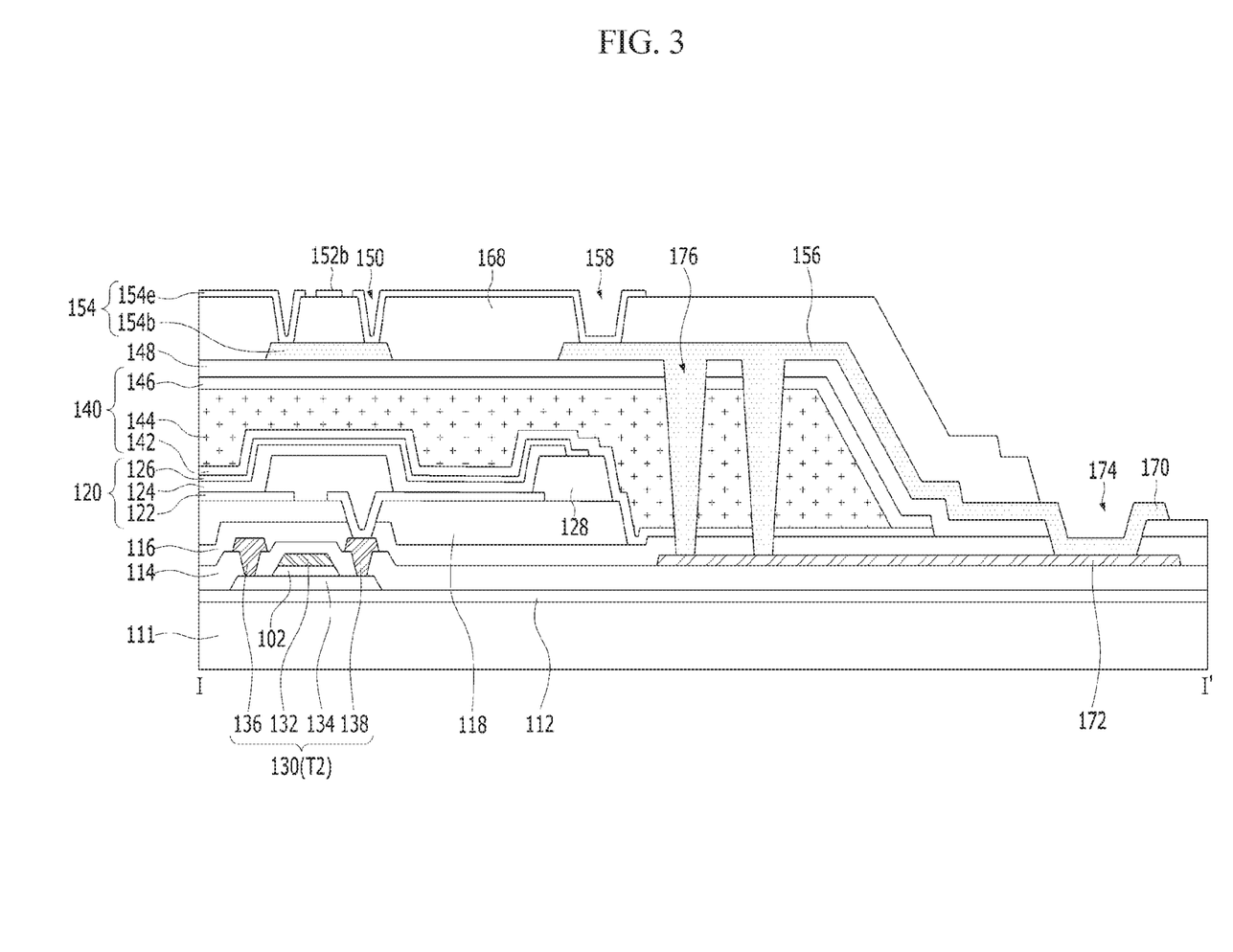
FIG. 3 is a cross-sectional view illustrating the organic light-emitting diode display device having the touch sensor taken along line I-I' of FIG. 2.

The driving transistor T2 or 130, as illustrated in FIG. 3, includes a semiconductor layer 134 disposed on a buffer layer 112, a gate electrode 132 overlapping the semiconductor layer 134 with a gate insulation layer 102 therebetween, and source and drain electrodes 136 and 138 formed on an interlayer insulation layer 114 to come into contact with the semiconductor layer 134. Here, the semiconductor layer 134 is formed of at least one of an amorphous semiconductor material, a polycrystalline semiconductor material, and an oxide semiconductor material.

The light-emitting element 120 includes an anode electrode 122, at least one light-emitting stack 124 formed on the anode electrode 122, and a cathode electrode 126 formed on the light-emitting stack 124.

The anode electrode 122 is electrically connected to the drain electrode 138 of the driving transistor T2 or 130, which is exposed through a pixel contact hole penetrated through a protective layer 116 and a pixel planarization layer 118.

The light-emitting stack 124 is formed on the anode electrode 122 in a light-emitting area that is defined by a bank 128. The light-emitting stack 124 is formed by stacking a hole-related layer, an organic emission layer, and an electron-related layer on the anode electrode 122 in this order or in the reverse order. In addition, the at least one light-emitting stack 124 may include first and second light-emitting stacks, which face each other with a charge generation layer therebetween. In this case, the organic emission layer of any one of the first and second light-emitting stacks generates blue light, and the organic emission layer of the other one of the first and second light-emitting stacks generates yellow-green light, whereby white light is generated via the first and second light-emitting stacks. Since the white light generated in the light-emitting stack 124 is incident on a color filter located above or under the light-emitting stack 124, a color image may be realized. In addition, colored light corresponding to each subpixel may be generated in each light-emitting stack 124 to realize a color image, without a separate color filter. That is, the light-emitting stack 124 of the red (R) subpixel may generate red light, the light-emitting stack 124 of the green (G) subpixel may generate green light, and the light-emitting stack 124 of the blue (B) subpixel may generate blue light.

The cathode electrode 126 may be formed so as to face the anode electrode 122 with the light-emitting stack 124 therebetween, and is connected to a low-voltage (VSS) supply line.

The encapsulation unit 140 prevents external moisture or oxygen from entering the light-emitting element 120, which is vulnerable to the external moisture or oxygen. To this end, the encapsulation unit 140 includes a plurality of inorganic encapsulation layers 142 and 146 and an organic encapsulation layer 144 disposed between the inorganic encapsulation layers 142 and 146. The inorganic encapsulation layer 146 is the uppermost layer. Here, the encapsulation unit 140 includes at least two inorganic encapsulation layers 142 and 146 and at least one organic encapsulation layer 144. In the present disclosure, the structure of the encapsulation unit 140 in which the organic encapsulation layer 144 is disposed between the first and second inorganic encapsulation layers 142 and 146 will be described by way of example.

The first inorganic encapsulation layer 142 is formed on the substrate 111, on which the cathode electrode 126 has been formed, so as to be closest to the light-emitting element 120. The first inorganic encapsulation layer 142 is formed of an inorganic insulation material that is capable of being deposited at a low temperature, such as silicon nitride ($SiN_x$), silicon oxide ($SiO_x$), silicon oxide nitride (SiON), or aluminum oxide ($Al_2O_3$). Thus, since the first inorganic encapsulation layer 142 is deposited under a low-temperature atmosphere, it is possible to prevent damage to the light-emitting stack 124, which is vulnerable to a high-temperature atmosphere, during the deposition process of the first inorganic encapsulation layer 142.

The organic encapsulation layer 144 serves to dampen stress between the respective layers due to bending of the organic light-emitting diode display device and to increase planarization performance. The organic encapsulation layer 144 is formed on the substrate 111, on which the first inorganic encapsulation layer 142 has been formed, using an organic insulation material, such as an acryl resin, epoxy resin, polyimide, polyethylene, or silicon oxycarbide (SiOC).

The second inorganic encapsulation layer 146 is formed on the substrate 111, on which the organic encapsulation layer 144 has been formed, so as to cover the upper surface and the side surface of each of the organic encapsulation layer 144 and the first inorganic encapsulation layer 142. Thus, the second inorganic encapsulation layer 146 minimizes or prevents external moisture or oxygen from entering the first inorganic encapsulation layer 142 and the organic encapsulation layer 144. The second inorganic encapsulation layer 146 is formed of an inorganic insulation material, such as silicon nitride ($SiN_x$), silicon oxide ($SiO_x$), silicon oxide nitride (SiON), or aluminum oxide ($Al_2O_3$).

On the encapsulation unit 140, a touch buffer layer 148 is disposed. The touch buffer layer 148 is formed between each of a touch sensing line 154 and a touch driving line 152 and the light-emitting element 120 so that the distance between each of a touch sensing line 154 and a touch driving line 152 and the cathode electrode 126 is maintained at the minimum 5 μm. Thereby, the capacitance of a parasitic capacitor formed between each of the touch sensing line 154 and the touch driving line 152 and the cathode electrode 126 may be minimized, and mutual interaction due to coupling between each of the touch sensing line 154 and the touch driving line 152 and the cathode electrode 126 may be prevented. Meanwhile, when the distance between each of a touch sensing line 154 and a touch driving line 152 and the cathode electrode 126 is below 5 μm, touch performance deteriorates due to the mutual interaction due to coupling between each of the touch sensing line 154 and the touch driving line 152 and the cathode electrode 126.

In addition, the touch buffer layer 148 may prevent a chemical solution (e.g., developing solution or etching solution) used in the process of manufacturing the touch sensing line 154 and the touch driving line 152, external moisture, and the like from entering the light-emitting stack 124. Thereby, the touch buffer layer 148 may prevent damage to the light-emitting stack 124, which is vulnerable to the chemical solution or moisture.

The touch buffer layer 148 may be formed at a low temperature that is equal to or less than 100° C., and may be formed of an organic or inorganic insulation material having a low dielectric constant ranging from 1 to 3, in order to prevent damage to the light-emitting stack 124, which is vulnerable to high temperatures. For example, the touch buffer layer 148 is formed of an acryl-based, epoxy-based, or siloxane-based material. The touch buffer layer 148 formed of an organic insulation material serves to damage to the respective encapsulation layers 142, 144 and 146 of the encapsulation unit 140 and the breakage of the touch sensing line 154 and the touch driving line 152 formed on the touch buffer layer 148 due to bending of the organic light-emitting diode display device.

On the touch buffer layer 148, the touch sensing line 154 and the touch driving line 152 are disposed so as to intersect each other with a touch insulation layer 168 between these 154 and 152 and the touch buffer layer 148. The term "intersect" is used herein to mean that one element crosses over or overlaps another element, and does not necessarily mean that the two elements contact each other. The mutual capacitance array Cm is formed at the intersection of the touch sensing line 154 and the touch driving line 152. Thus, the mutual capacitance array Cm serves as a touch sensor by storing charges in response to a touch driving pulse supplied to the touch driving line 152 and discharging the stored charge to the touch sensing line 154.

The touch driving line 152 includes a plurality of first touch electrodes 152e, and first bridges 152b, which electrically interconnect the first touch electrodes 152e.

The first touch electrodes 152e are equidistantly spaced apart from each other in the Y-direction, which is a first direction, on the touch insulation layer 168. Each of the first touch electrodes 152e is electrically connected to an adjacent first touch electrode 152e via the first bridge 152b.

The first bridge 152b is disposed on the touch insulation layer 168 in the same plane as the first touch electrode 152e, and is electrically connected to the first touch electrode 152e without a separate contact hole. Since the first bridge 152b is disposed so as to overlap the bank 128, it is possible to prevent deterioration in the aperture ratio due to the first bridge 152b.

The touch sensing line 154 includes a plurality of second touch electrodes 154e, and second bridges 154b, which electrically interconnect the second touch electrodes 154e.

The second touch electrodes 154e are equidistantly spaced apart from each other in the X-direction, which is a second direction, on the touch insulation layer 168. Each of the second touch electrodes 154e is electrically connected to an adjacent second touch electrode 154e via the second bridge 154b.

The second bridge 154b is formed on the touch buffer layer 148, and is exposed through a touch contact hole 150, which is penetrated through the touch insulation layer 168, so as to be electrically connected to the second touch electrode 154e. The second bridge 154b is disposed so as to overlap the bank 128, in the same manner as the first bridge 152b, which may prevent damage to the aperture ratio due to the second bridge 154b.

In this way, the touch driving line 152 and the touch sensing line 154 of the present disclosure are connected respectively to a touch pad 170 via a routing line 156.

The routing line 156 extends from the first touch electrode 152e to at least one of the upper side and the lower side of an active area AA so as to be connected to the touch pad 170. The routing line 156 also extends from the second touch electrode 154e to at least one of the right side and the left side of the active area so as to be connected to the touch pad 170. The arrangement of the routing line 156 may be changed in various ways according to design requirements of the display device.

The routing line 156 is formed between each of the first and second touch electrodes 152e and 154e and the touch pad 170, and electrically interconnects each of the first and second touch electrodes 152e and 154e and the touch pad 170. The upper portion of the routing line 156 is exposed through a routing contact hole 158, which is penetrated through the touch insulation layer 168, and is electrically connected to each of the first and second touch electrodes 152e and 154e above the encapsulation unit 140. The side portion of the routing line 156, as illustrated in FIG. 3, may be disposed so as to cover the side surface of the touch buffer layer 148 in the display device having the touch buffer layer 148, or may be disposed so as to cover the side surface of the second inorganic encapsulation layer 146 in the display device having no touch buffer layer 148. In addition, the lower portion of the routing line 156 is disposed on one of the touch buffer layer 148, the planarization layer 118, the protective layer 116, the interlayer insulation layer 114, the gate insulation layer 102, and the buffer layer 112, which are insulation layers disposed under the first and second touch electrodes 152e and 154e.

Figure 4:
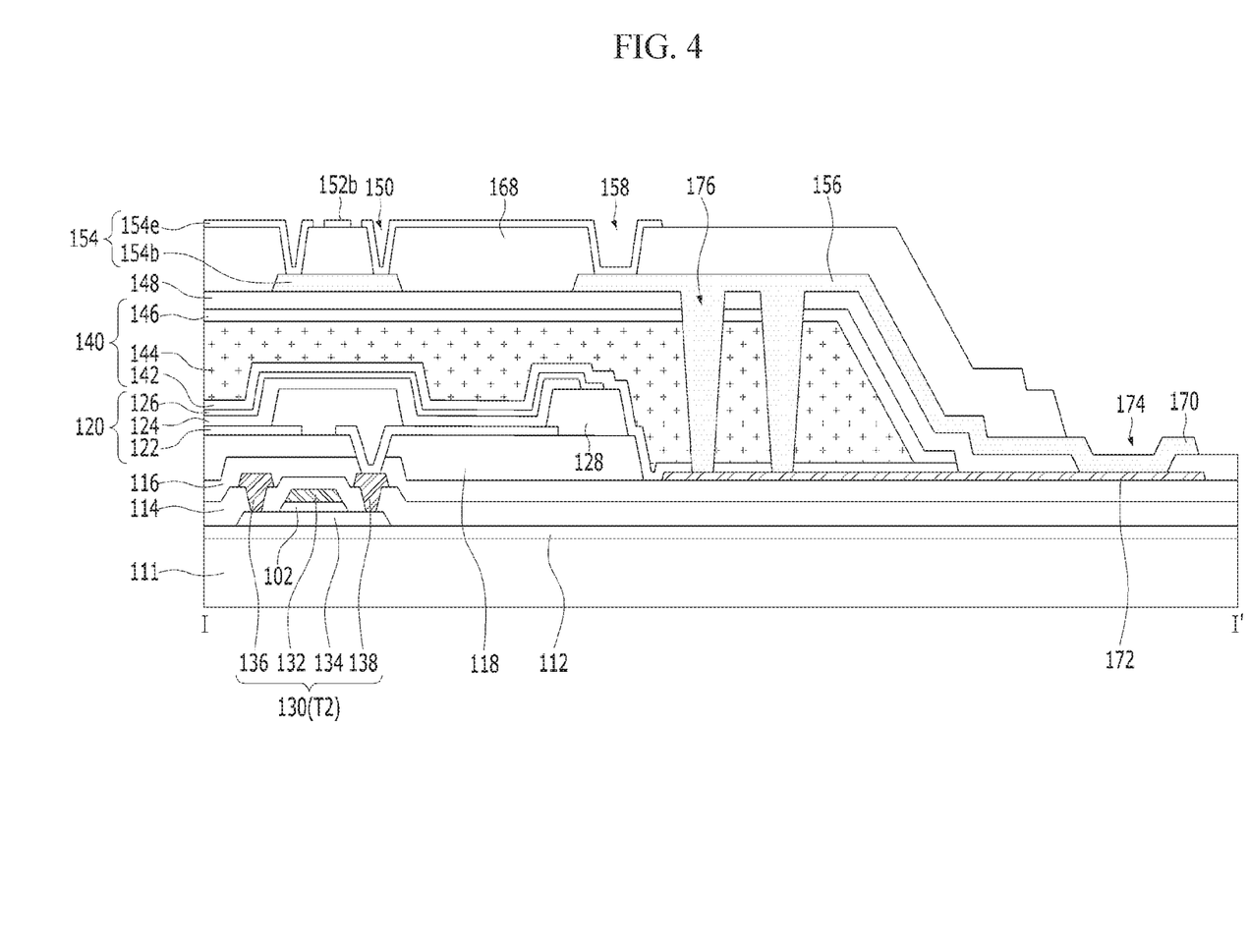
FIG. 4 is a cross-sectional view illustrating another embodiment of an auxiliary conductive layer illustrated in FIG. 3.

In addition, the routing line 156, as illustrated in FIG. 3 or 4, is connected to an auxiliary conductive layer 172 through an auxiliary contact hole 176 under the encapsulation unit 140, and the auxiliary conductive layer 172 is connected to the touch pad 170 through a pad contact hole 174. To this end, the auxiliary conductive layer 172, as illustrated in FIGS. 2 to 4, is formed under the routing line 156 and the touch pad 170 so as to extend along the routing line 156 and the touch pad 170.

Specifically, the auxiliary conductive layer 172 illustrated in FIG. 3 is formed using the same material as the source and drain electrodes 136 and 138, and is disposed on the interlayer insulation layer 114 in the same plane as the electrodes 136 and 138. The auxiliary conductive layer 172 is exposed through the auxiliary contact hole 176, which is penetrated through the touch buffer layer 148, the encapsulation unit 140, and the protective layer 116, and is connected to the routing line 156. The auxiliary conductive layer 172 is also exposed through the pad contact hole 174, which is penetrated through the touch buffer layer 148 and the protective layer 116, and is connected to the touch pad 170.

The auxiliary conductive layer 172 illustrated in FIG. 4 is formed using the same material as one of the anode electrode 122 and the cathode electrode 126, and is disposed on the protective layer 116. The auxiliary conductive layer 172 is exposed through the auxiliary contact hole 176, which is penetrated through the touch buffer layer 148 and the encapsulation unit 140, and is connected to the routing line 156. The auxiliary conductive layer 172 is also exposed through the pad contact hole 174, which is penetrated through the touch buffer layer 148, and is connected to the touch pad 170. Here, each of the auxiliary contact hole 176 and the pad contact hole 174 illustrated in FIG. 4 has a depth smaller than that of each of the auxiliary contact hole 176 and the pad contact hole 174 illustrated in FIG. 3. Thus, each of the auxiliary contact hole 176 and the pad contact hole 174 illustrated in FIG. 4 enables reduction in the number of processes and the processing time, thus resulting in an increased process margin, compared to each of the auxiliary contact hole 176 and the pad contact hole 174 illustrated in FIG. 3.

Figure 5:
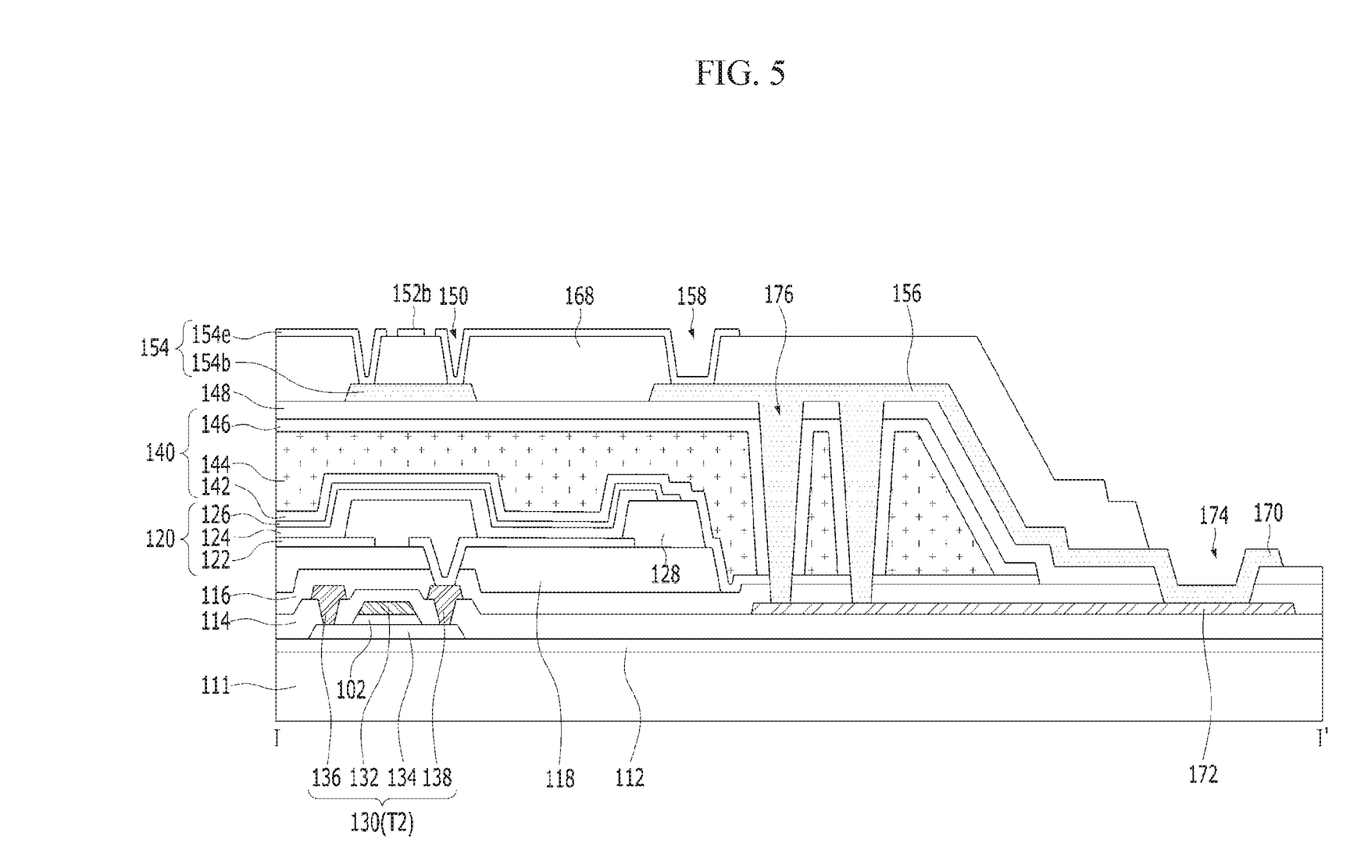
FIG. 5 is a cross-sectional view illustrating another embodiment of an auxiliary contact hole illustrated in FIG. 3.

Meanwhile, the structure in which the side surface of the organic encapsulation layer 144 illustrated in FIGS. 3 and 4 is exposed through the auxiliary contact hole 176, which is penetrated through the plurality of inorganic encapsulation layers 142 and 146 and the at least one organic encapsulation layer 144 has been described by way of example, alternatively, as illustrated in FIG. 5, the side surface of the organic encapsulation layer 144 in the area corresponding to the auxiliary contact hole 176 may be covered with the second inorganic encapsulation layer 146, which is the uppermost layer among the plurality of inorganic encapsulation layers. In this way, the second inorganic encapsulation layer 146 may minimize or prevent external moisture or oxygen from entering the side surface of the organic encapsulation layer 144 in the area corresponding to the auxiliary contact hole 176.

Figure 6:
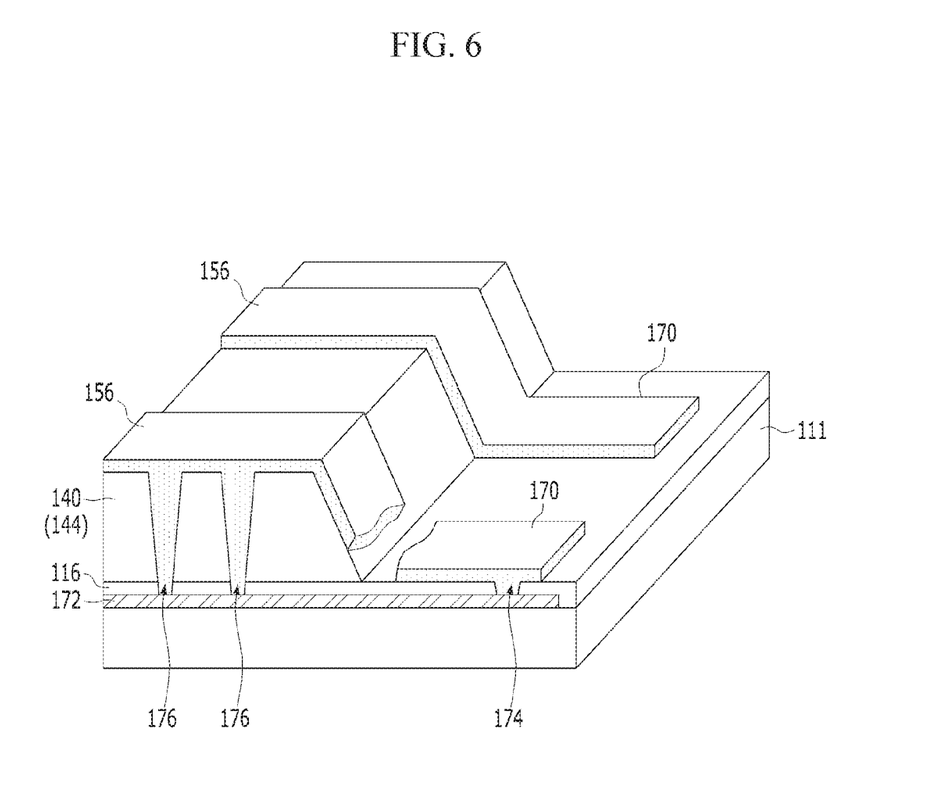
FIG. 6 is a perspective view for explaining a connection relationship between a routing line and a touch pad via the auxiliary conductive layer illustrated in FIG. 3.

In this way, the auxiliary conductive layer 172 illustrated in FIGS. 3 to 5 is connected to the routing line 156 as well as the touch pad 170. Thus, due to the stepped and tapered shape of the organic encapsulation layer 144, as illustrated in FIG. 6, the routing line 156 is connected to the touch pad 170 via the auxiliary conductive layer 172 even if the routing line 156 is disconnected at the boundary of the organic encapsulation layer 144. In particular, in the case where the display device of the present disclosure is applied to a flexible display, such as a rollable, bendable, foldable, or stretchable display, the auxiliary conductive layer 172 receives lower bending stress than the routing line 156. That is, since at least one of the protective layer and the encapsulation unit is disposed so as to cover the auxiliary conductive layer 172, the auxiliary conductive layer 172 disposed under the routing line 156 is not damaged by the stress due to the bending of a pad area. Thereby, even if the routing line 156, on which bending stress is concentrated, is disconnected, the routing line 156 may be connected to the touch pad 170 via the auxiliary conductive layer 172, and therefore, the present disclosure may prevent poor reliability caused in the case of a flexible display.

In addition, through the stepped and tapered shape of the organic encapsulation layer 144, a photoresist pattern (not illustrated) for patterning the routing line 156 disposed on the encapsulation unit 140 may be partially removed, or may excessively remain. When the routing line 156 is patterned using the partially removed photoresist pattern, a disconnection fault of the routing line 156 occurs at the boundary of the organic encapsulation layer 144. However, in the present disclosure, as illustrated in FIG. 6, even if the routing line 156 is disconnected at the boundary of the organic encapsulation layer 144, the routing line 156 is connected to the touch pad 170 via the auxiliary conductive layer 172, which may result in increased yield and reliability. In addition, when the routing line 156 is patterned using the excessively remaining photoresist pattern, short-circuit of adjacent routing lines may occur at the boundary of the organic encapsulation layer 144. However, in the present disclosure, the routing lines 156, which have undergone short-circuit, may be separated through a repair process using a laser or the like, which results in increased yield. In addition, even if the routing line 156 is disconnected due to a process fault during the repair process, as illustrated in FIG. 6, the routing line 156 may be connected to the touch pad 170 via the auxiliary conductive layer 172.

The touch pad 170 is disposed on either side of the area in which a display pad is disposed so as to be connected to at least one of the scan line SL and the data line DL disposed in the active area. The touch pad 170 may be disposed on one side of the display panel, and the display pad may be disposed on the other side of the display panel.

The touch pad 170 extends from the routing line 156 and is connected to the routing line 156. To this end, the touch pad 170 is formed through the same mask process using the same material as the routing line 156. The touch pad 170 may be formed through the same mask process as at least one of the first touch electrode 152e and the second touch electrode 154e using the same material as at least one of the first touch electrode 152e and the second touch electrode 154e.

Figure 7:
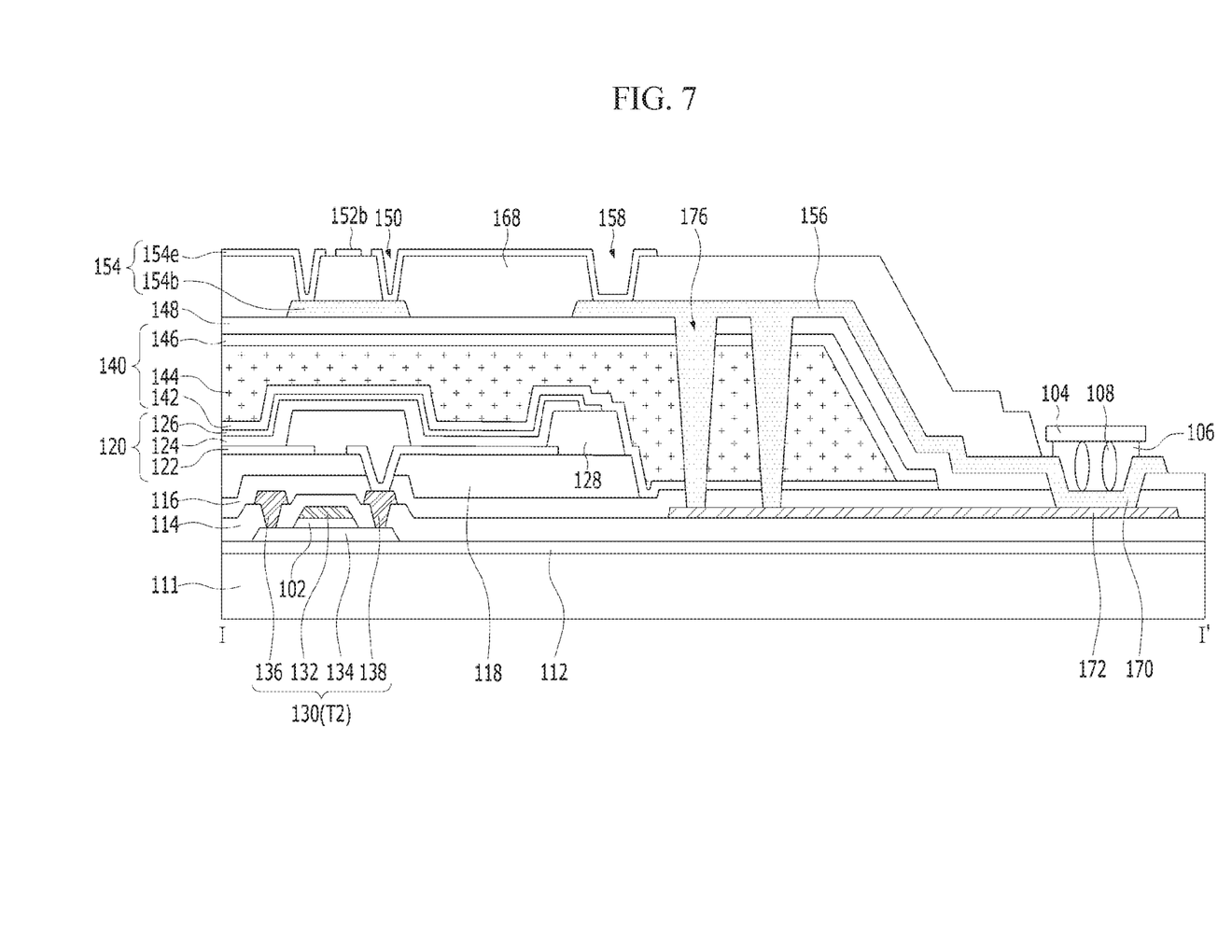
FIG. 7 is a cross-sectional view illustrating a touch driving integrated circuit connected to the touch pad illustrated in FIG. 3.

The touch pad 170, as illustrated in FIG. 7, is connected to a touch driving integrated circuit 104 via a signal transmission film 106 including conductive particles 108. Thus, a touch driving pulse generated in the touch driving integrated circuit 104 is transmitted to the touch driving line 152 via the touch pad 170 and the routing line 156, and a touch signal from the touch sensing line 154 is transmitted to the touch driving integrated circuit 104 via the routing line 156 and the touch pad 170.

In this way, in the present disclosure, the auxiliary conductive layer 172 is connected to the routing line 156 as well as the touch pad 170. Thereby, even if a disconnection fault occurs in the routing line 156, the routing line 156 and the touch pad 170 are electrically connected to each other via the auxiliary conductive layer 172, which may result in increased yield and reliability. In addition, a conventional organic light-emitting diode display device includes a touch-screen attached thereto using an adhesive, whereas an organic light-emitting diode display device of the present disclosure includes the touch electrodes 152e and 154e disposed on the encapsulation unit 140, which may make a separate attachment process be unnecessary, resulting in a simplified manufacturing process and reduced costs.

Figure 8:
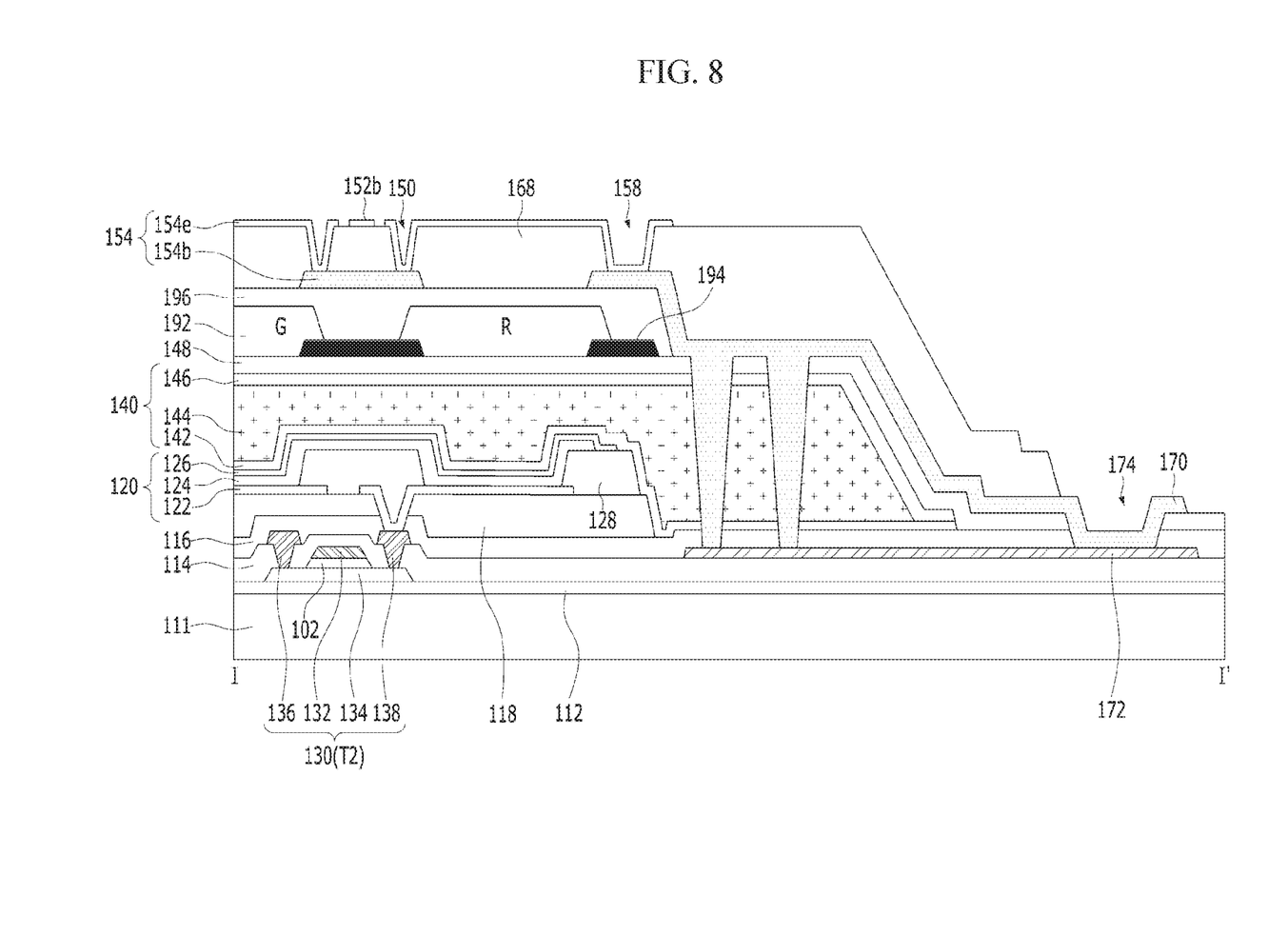
FIG. 8 is a cross-sectional view illustrating an organic light-emitting diode display device having a touch sensor according to a second embodiment of the present disclosure.

FIG. 8 is a cross-sectional view illustrating an organic light-emitting diode display device according to a second embodiment of the present disclosure.

The organic light-emitting diode display device illustrated in FIG. 8 includes the same constituent elements as those of the organic light-emitting diode display device illustrated in FIG. 3, except that it further includes color filters 192 disposed between the encapsulation unit 140 and the touch electrodes 152e and 154e. Thus, a detailed description related to the same constituent elements will be omitted below.

The color filters 192 are formed between each of the touch sensing line 154 and the touch driving line 152 and the light-emitting element 120. The distance between each of the touch sensing line 154 and the touch driving line 152 and the light-emitting element 120 is increased by the color filters 192. Thereby, the capacitance of a parasitic capacitor formed between each of the touch sensing line 154 and the touch driving line 152 and the light-emitting element 120 may be minimized, and mutual interaction due to coupling between each of the touch sensing line 154 and the touch driving line 152 and the light-emitting element 120 may be prevented. In addition, the color filters 192 may prevent a chemical solution (e.g., developing solution or etching solution) used in the process of manufacturing the touch sensing line 154 and the touch driving line 152, external moisture, and the like from entering the light-emitting stack 124. Thereby, the color filters 192 may prevent damage to the light-emitting stack 124, which is vulnerable to the chemical solution or moisture. Meanwhile, as illustrated in FIG. 8, the configuration in which the touch electrodes 152e and 154e are disposed over the color filters 192 has been described by way of example, but the color filters 192 may be disposed over the touch electrodes 152e and 154e. In this case, the touch electrodes 152e and 154e are disposed between the color filters 192 and the encapsulation unit 140.

A black matrix 194 is disposed between the color filters 192. The black matrix 194 serves to separate the respective subpixel areas from each other and to prevent optical interference and light leakage between adjacent subpixel areas. The black matrix 194 may be formed of a high-resistance black insulation material, or may be formed by stacking at least two colors of color filters among red (R), green (G), and blue (B) color filters 192. In addition, a touch planarization layer 196 is formed on the substrate 111 having the color filters 192 and the black matrix 194 formed thereon. The substrate 111 having the color filters 192 and the black matrix 194 formed thereon is flattened by the touch planarization layer 196.

In this way, in the present disclosure, the auxiliary conductive layer 172 is connected to the routing line 156 as well as the touch pad 170. Thereby, even if short-circuit occurs in the routing line 156, the routing line 156 and the touch pad 170 are electrically connected to each other via the auxiliary conductive layer 172, which may result in increased yield and reliability. In addition, a conventional organic light-emitting diode display device includes a touchscreen attached thereto using an adhesive, whereas an organic light-emitting diode display device of the present disclosure includes the touch electrodes 152e and 154e disposed on the encapsulation unit 140, which may make a separate attachment process be unnecessary, resulting in a simplified manufacturing process and reduced costs.

Figure 9A:
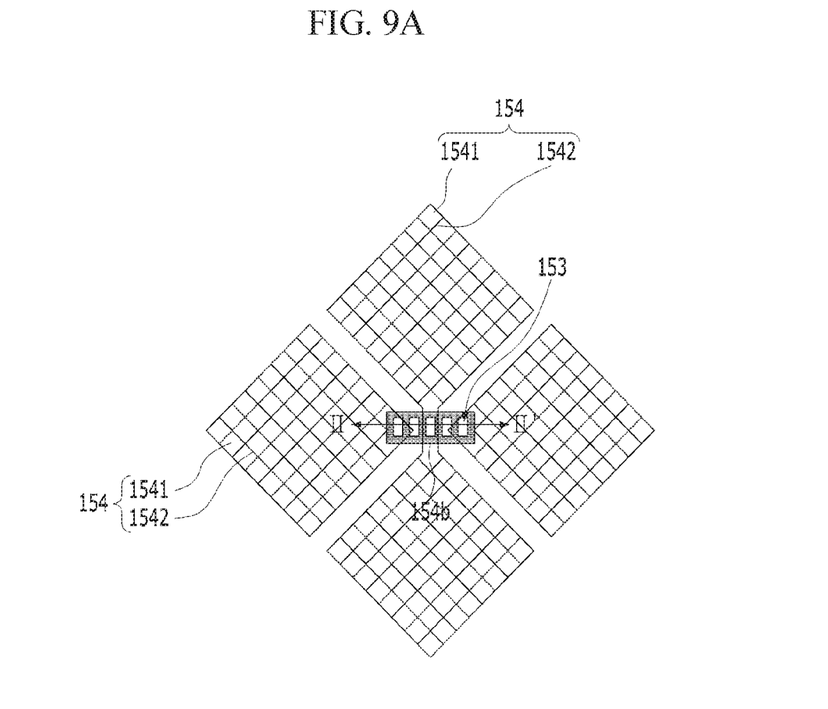
FIGS. 9A and 9B are a plan view and a cross-sectional view, respectively, illustrating another embodiment of first and second touch electrodes and bridges illustrated in FIGS. 2 and 3.
Figure 9B:
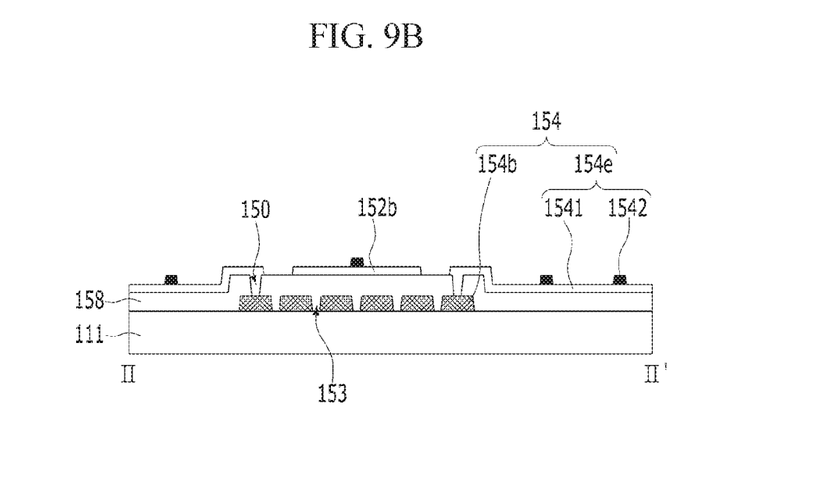

Meanwhile, in the present disclosure, the configuration in which the first and second touch electrodes 152e and 154e and the first and second bridges 152b and 154b are formed to have a plate shape, as illustrated in FIG. 2, has been described by way of example, the first and second touch electrodes 152e and 154e and the first and second bridges 152b and 154b may be formed to have a mesh shape, as illustrated in FIGS. 9A and 9B. That is, the first and second touch electrodes 152e and 154e and the first bridge 152b may be formed of a transparent conductive layer 1541, such as ITO or IZO, and a mesh metal layer 1542 disposed above or under the transparent conductive layer 1541 and having a mesh shape. Alternatively, the touch electrodes 152e and 154e and the first bridge 152b may be formed of only the mesh metal layer 1542 without the transparent conductive layer 1541, or may be formed of the transparent conductive layer 1541 having a mesh shape without the mesh metal layer 1542. Here, the mesh metal layer 1542 is formed to have a mesh shape using a conductive layer of at least one of Ti, Al, Mo, MoTi, Cu, Ta, and ITO, so as to have higher conductivity than the transparent conductive layer 1541. For example, the mesh metal layer 1542 is formed in a triple-layered structure as a stack of Ti/Al/Ti, MoTi/Cu/MoTi, or Ti/Al/Mo. Thereby, the resistance and the capacitance of the first and second touch electrodes 152e and 154e and the first bridge 152b may be reduced, and the RC time constant may be reduced, which may result in increased touch sensitivity. In addition, since the mesh metal layer 1542 of each of the first and second touch electrodes 152e and 154e and the first bridge 152b has a very small line width, it is possible to prevent deterioration in the aperture ratio and transmissivity due to the mesh metal layer 1542.

In addition, the second bridge 154b, which is disposed in a plane different from the touch electrodes 152e and 154e, includes a plurality of slits 153, as illustrated in FIGS. 9A and 9B. The second bridge 154b having the slits 153 may have a reduced surface area, compared to the first bridge 152b having no slit 153. Thereby, the reflection of external light by the second bridge 154b may be reduced, which may prevent deterioration in visibility. Since the second bridge 154b having the slits 153 overlaps the bank 128, it is possible to prevent deterioration in the aperture ratio by the second bridge 154b formed of an opaque conductive layer.

Moreover, in the present disclosure, the mutual-capacitance-type touch sensor, which includes the touch sensing line 154 and the touch driving line 152 intersecting each other with the touch insulation layer 168 therebetween, has been described by way of example, the present disclosure may also be applied to a self-capacitance-type touch sensor Cs. Each of a plurality of self-capacitance-type touch electrodes has an electrically independent self-capacitance, and thus is used as a self-capacity-type touch sensor that senses variation in capacitance by a user touch. That is, the routing lines 156 connected to the self-capacitance-type touch electrodes are connected not only to the touch pad 170 through the pad contact hole 174 but also to the auxiliary conductive layer 172 through the auxiliary contact hole 176. Thereby, even if a disconnection fault of the routing line 156 occurs at the boundary of the organic encapsulation layer 144, the routing line 156 is connected to the touch pad 170 via the auxiliary conductive layer 172, which results in increased yield.

As is apparent from the above description, a display device according to the present disclosure includes an auxiliary conductive layer, which is connected to a touch pad and is also connected to a routing line under an encapsulation unit. Thereby, according to the present disclosure, even if short-circuit occurs in the routing line, the routing line and the touch pad may be electrically connected to each other via the auxiliary conductive layer. In addition, a conventional organic light-emitting diode display device includes a touchscreen attached thereto using an adhesive, whereas an organic light-emitting diode display device of the present disclosure includes touch electrodes disposed on the encapsulation unit, which may make a separate attachment process be unnecessary, resulting in a simplified manufacturing process and reduced costs.

Although the embodiments of the present disclosure have been described above in detail with reference to the accompanying drawings, it will be apparent to those skilled in the art that the present disclosure described above is not limited to the embodiments described above, and various substitutions, modifications, and alterations may be devised within the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
   a light-emitting element disposed on a substrate;
   an encapsulation unit disposed on the light-emitting element;
   an element insulation layer between the encapsulation unit and the substrate;
   a touch sensor disposed on the encapsulation unit;
   a touch pad connected to the touch sensor;
   a routing line disposed between the touch pad and the touch sensor, the routing line electrically coupling the touch pad to the touch sensor; and
   an auxiliary conductive layer connected to the touch pad and the routing line through an auxiliary contact hole penetrating through at least one of the encapsulation unit and the element insulation layer;
   wherein at least a portion of the auxiliary conductive layer is disposed between the substrate and the routing line.

2. The display device according to claim 1, wherein at least a portion of the auxiliary conductive layer is disposed between the substrate and the touch pad.

3. The display device according to claim 1, wherein at least a portion of the auxiliary conductive layer is disposed under the encapsulation unit.

4. The display device according to claim 1, further comprising a touch buffer layer disposed between the touch sensor and the encapsulation unit,
   wherein the auxiliary conductive layer is connected to the touch pad and the routing line through the auxiliary contact hole, and the auxiliary contact hole penetrates through at least one of the encapsulation unit, the touch buffer layer and the element insulation layer.

5. The display device according to claim 1, further comprising:
   a touch buffer layer disposed between the touch sensor and the encapsulation unit; and
   a touch insulating layer on the touch buffer layer,
   wherein the auxiliary conductive layer is connected to the touch pad and the routing line through the auxiliary contact hole, and the auxiliary contact hole penetrates through at least one of the encapsulation unit, the touch buffer layer and the element insulation layer.

6. The display device according to claim 1, further comprising a thin-film transistor connected to the light-emitting element,
   wherein the auxiliary conductive layer is formed using a same material on a same layer as at least one of a plurality electrodes included in the thin-film transistor.

7. The display device according to claim 6, wherein the element insulation layer includes a protective layer disposed to cover the thin-film transistor,
   wherein the protective layer and the encapsulation unit are disposed to cover the auxiliary conductive layer, and
   wherein the routing line is connected to the auxiliary conductive layer through an auxiliary contact hole, and the auxiliary contact hole penetrates through the protective layer and the encapsulation unit.

8. The display device according to claim 7, further comprising a touch buffer layer disposed between the touch sensor and the encapsulation unit,
   wherein the touch pad is connected to the auxiliary conductive layer through a pad contact hole, and the auxiliary contact hole penetrates through the protective layer and the touch buffer layer disposed above the auxiliary conductive layer.

9. The display device according to claim 8, wherein the routing line is disposed to cover a side surface of one of the encapsulation unit and the touch buffer layer.

10. The display device according to claim 7, wherein the encapsulation unit comprises a plurality of inorganic encapsulation layers and at least one organic encapsulation layer disposed between the inorganic encapsulation layers, and
    wherein the auxiliary contact hole penetrates through the inorganic encapsulation layers and the organic encapsulation layer.

11. The display device according to claim 1, wherein the element insulation layer includes a protective layer disposed to cover the thin-film transistor, and
    wherein the auxiliary conductive layer is formed using a same material as at least one of an anode electrode and a cathode electrode of the light-emitting element, and is disposed on the protective layer.

12. The display device according to claim 11, wherein the encapsulation unit is disposed to cover the auxiliary conductive layer, and
    wherein the routing line is connected to the auxiliary conductive layer through the auxiliary contact hole, and the auxiliary contact hole penetrates through the encapsulation unit.

13. The display device according to claim 12, further comprising a touch buffer layer disposed between the touch sensor and the encapsulation unit,
    wherein the touch pad is connected to the auxiliary conductive layer through a pad contact hole, and the pad contact hole penetrates through the touch buffer layer disposed above the auxiliary conductive layer.

14. The display device according to claim 13, wherein the routing line is disposed to cover a side surface of one of the encapsulation unit and the touch buffer layer.

15. The display device according to claim 12, wherein the encapsulation unit comprises a plurality of inorganic encapsulation layers and at least one organic encapsulation layer disposed between the inorganic encapsulation layers, and
    wherein the auxiliary contact hole penetrates through the inorganic encapsulation layers and the organic encapsulation layer.

16. The display device according to claim 15, wherein, among the inorganic encapsulation layers, an uppermost inorganic encapsulation layer is disposed to cover a side surface of the organic encapsulation layer that is exposed through the auxiliary contact hole.

17. The display device according to claim 1, further comprising a color filter disposed between the encapsulation unit and the touch sensor.

18. The display device according to claim 1, wherein the touch sensor comprises a touch sensing line and a touch driving line disposed to intersect each other above the encapsulation unit,
    wherein the touch driving line comprises:
    first touch electrodes arranged on the encapsulation unit in a first direction; and a first bridge configured to interconnect the first touch electrodes, and wherein the touch sensing line comprises:

second touch electrodes arranged in a second direction intersecting the first direction; and a second bridge configured to interconnect the second touch electrodes.

19. The display device according to claim 18, wherein at least one of the first bridge and the second bridge comprises at least one slit.

20. The display device according to claim 18, wherein at least one of the first touch electrodes, the second touch electrodes, the first bridge, and the second bridge has a mesh shape.

* * * * *